(12) United States Patent
Kim et al.

(10) Patent No.: US 12,009,277 B2
(45) Date of Patent: *Jun. 11, 2024

(54) SEMICONDUCTOR PACKAGE

(71) Applicant: SAMSUNG ELECTRONICS CO., LTD., Suwon-si (KR)

(72) Inventors: Dong Kyu Kim, Anyang-si (KR); Jung-Ho Park, Cheonan-si (KR); Jong Youn Kim, Seoul (KR); Yeon Ho Jang, Goyang-si (KR); Jae Gwon Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/866,866

(22) Filed: Jul. 18, 2022

(65) Prior Publication Data
US 2022/0352050 A1     Nov. 3, 2022

Related U.S. Application Data

(63) Continuation of application No. 16/743,284, filed on Jan. 15, 2020, now Pat. No. 11,404,346.

(30) Foreign Application Priority Data

Jun. 28, 2019    (KR) .................. 10-2019-0077851

(51) Int. Cl.
*H01L 23/367*     (2006.01)
*H01L 21/48*     (2006.01)
(Continued)

(52) U.S. Cl.
CPC ...... *H01L 23/3675* (2013.01); *H01L 21/4871* (2013.01); *H01L 21/6835* (2013.01);
(Continued)

(58) Field of Classification Search
CPC ............ H01L 25/0655; H01L 21/4871; H01L 23/3675; H01L 24/16; H01L 25/18;
(Continued)

(56) References Cited

U.S. PATENT DOCUMENTS

| 9,059,072 B2 | 6/2015 | Choi et al. |
| 9,911,700 B2 | 3/2018 | Hurwitz et al. |

(Continued)

FOREIGN PATENT DOCUMENTS

| KR | 10-2012-0082189 A | 7/2012 |
| KR | 10-1391089 B1 | 4/2014 |
| WO | WO 2019/066998 A1 | 4/2019 |

OTHER PUBLICATIONS

Korean Office Action dated Aug. 19, 2023, of the corresponding Korean Application No. 10-2019-0077851.

*Primary Examiner* — Thanh Y. Tran
(74) *Attorney, Agent, or Firm* — Fish & Richardson P.C.

(57) ABSTRACT

A semiconductor package includes a first semiconductor chip and a second semiconductor chip on a substrate, a barrier layer on the first semiconductor chip and the second semiconductor chip, the barrier layer having an opening through which at least a part of the first semiconductor chip is exposed, and a heat transfer part on the barrier layer, the heat transfer part extending along an upper face of the barrier layer and filling the opening.

20 Claims, 16 Drawing Sheets

(51) Int. Cl.
*H01L 21/683* (2006.01)
*H01L 21/78* (2006.01)
*H01L 23/00* (2006.01)
*H01L 25/00* (2006.01)
*H01L 25/065* (2023.01)
*H01L 25/18* (2023.01)

(52) U.S. Cl.
CPC .............. *H01L 21/78* (2013.01); *H01L 24/16* (2013.01); *H01L 25/0655* (2013.01); *H01L 25/18* (2013.01); *H01L 25/50* (2013.01); *H01L 2221/68331* (2013.01); *H01L 2224/16225* (2013.01); *H01L 2924/1431* (2013.01); *H01L 2924/1434* (2013.01)

(58) Field of Classification Search
CPC ....... H01L 21/6835; H01L 2221/68331; H01L 21/78; H01L 2221/68345; H01L 2924/1434; H01L 2224/16225; H01L 2924/1431; H01L 23/36; H01L 23/367; H01L 25/071
See application file for complete search history.

(56) References Cited

U.S. PATENT DOCUMENTS

| | | |
|---|---|---|
| 10,170,456 B2 | 1/2019 | Sung et al. |
| 10,504,824 B1 | 12/2019 | Pan et al. |
| 11,404,346 B2 * | 8/2022 | Kim ................... H01L 21/4871 |
| 2006/0055028 A1 | 3/2006 | Hasunuma |
| 2009/0093072 A1 * | 4/2009 | Hua ...................... H01L 23/367 |
| | | 257/E21.53 |
| 2011/0084379 A1 | 4/2011 | Sato |
| 2012/0171814 A1 | 7/2012 | Choi et al. |
| 2017/0345763 A1 | 11/2017 | Cheah et al. |
| 2018/0068978 A1 | 3/2018 | Jeng et al. |
| 2019/0051607 A1 | 2/2019 | Suk et al. |
| 2019/0074237 A1 | 3/2019 | Beauchemin et al. |
| 2019/0206807 A1 | 7/2019 | Cho |
| 2020/0235082 A1 | 7/2020 | Eid et al. |
| 2021/0043544 A1 * | 2/2021 | Eid ..................... H03H 9/0542 |

* cited by examiner

SEMICONDUCTOR PACKAGE

CROSS-REFERENCE TO RELATED APPLICATIONS

This is a continuation application based on pending application Ser. No. 16/743,284, filed on Jan. 15, 2020, the entire contents of which is hereby incorporated by reference.

Korean Patent Application No. 10-2019-0077851, filed on Jun. 28, 2019, in the Korean Intellectual Property Office, and entitled: "Semiconductor Package," is incorporated by reference herein in its entirety.

BACKGROUND

1. Field

Embodiments relate to a semiconductor package.

2. Description of the Related Art

Recently, with demands for high performance, a semiconductor chip size and an accompanying semiconductor package size have increased. Meanwhile, the thickness of the semiconductor package has rather decreased with a sliming tendency of an electronic device. A semiconductor package may provide multi-functionality, high capacity, and miniaturization. By integrating a plurality of semiconductor chips in a single semiconductor package, it has become possible to provide high capacity and multiple functions, while greatly reducing the size of the semiconductor package.

SUMMARY

Embodiments are directed to a semiconductor package, including a first semiconductor chip and a second semiconductor chip on a substrate, a barrier layer on the first semiconductor chip and the second semiconductor chip, the barrier layer having an opening through which at least a part of the first semiconductor chip is exposed, and a heat transfer part on the barrier layer, the heat transfer part extending along an upper face of the barrier layer and filling the opening.

Embodiments are also directed to a semiconductor package, including a first semiconductor chip on a substrate, a second semiconductor chip on the substrate and spaced apart from the first semiconductor chip, and a heat transfer part on the first semiconductor chip and the second semiconductor chip, the heat transfer part being in direct contact with the first semiconductor chip, and not contacting the second semiconductor chip.

Embodiments are also directed to a semiconductor package, including a substrate, a molding part on the substrate and including a first trench and a second trench through which an upper face of the substrate is exposed, a first semiconductor chip in the first trench and electrically connected to the substrate, a second semiconductor chip in the second trench and electrically connected to the substrate, a barrier layer on an upper face of the molding part, the barrier layer covering the second semiconductor chip and including an opening through which at least a part of the first semiconductor chip is exposed, and a heat transfer part on the barrier layer and in direct contact with the first semiconductor chip exposed by the opening.

BRIEF DESCRIPTION OF THE DRAWINGS

Features will become apparent to those of skill in the art by describing in detail example embodiments with reference to the attached drawings in which.

DETAILED DESCRIPTION

Figure 1:
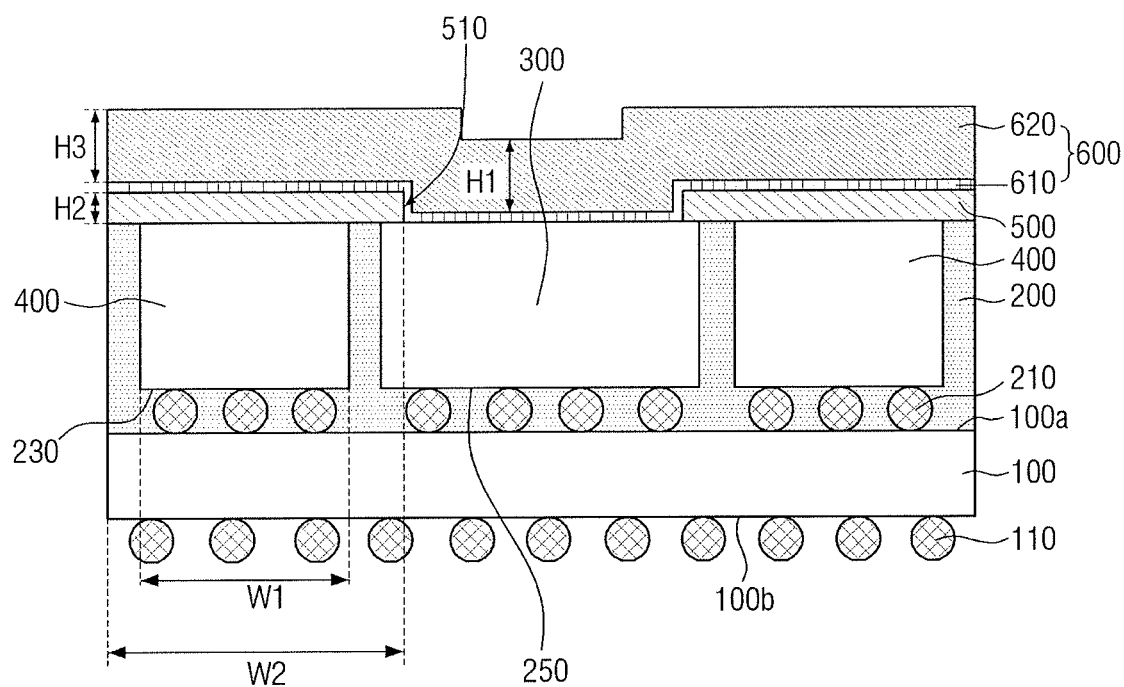
FIG. 1 illustrates a diagram of a semiconductor package according to an example embodiment.

FIG. 1 is a diagram of a semiconductor package according to an example embodiment.

Referring to FIG. 1, a semiconductor package according to an example embodiment may include a substrate 100, a first connection terminal 110, a molding part 200, a second connection terminal 210, a first semiconductor chip 300, a second semiconductor chip 400, a barrier layer 500, and a heat transfer part 600.

The substrate 100 may be an interposer substrate, and may include, for example, FR4, polyimide, silicon, or glass.

The substrate 100 may include an upper face 100a and a lower face 100b facing each other.

The first connection terminal 110 may be disposed on the lower face 100b of the substrate 100. The first connection terminal 110 may include, for example, conductive bumps. The first connection terminal 110 may be a conductive ball or a solder ball.

The semiconductor package may be electrically connected to an external device or another package substrate through the first connection terminal 110. The number of the first connection terminals 110 shown in the drawing is for convenience of explanation, and may be varied.

The first semiconductor chip 300 and the second semiconductor chip 400 may be disposed on the upper face 100a of the substrate 100. The second connection terminal 210 may be disposed on one face of the first semiconductor chip 300 and one face of the second semiconductor chip 400.

The second connection terminal 210 may be, for example, a solder ball or a conductive bump. The first semiconductor chip 300 and the second semiconductor chip 400 may be electrically connected to the substrate 100 through the second connection terminal 210.

The substrate 100 may include a plurality of insulating films and internal wiring layers. The first semiconductor chip 300 and the second semiconductor chip 400 may be electrically connected to each other through the internal wiring layer of the substrate 100.

The first semiconductor chip 300 and the second semiconductor chip 400 may be memory chips or logic chips. In the following description, the first semiconductor chip 300 may be a logic chip, and the second semiconductor chip 400 may be a memory chip.

The logic chip may be, for example, a central processing unit (CPU), a controller, an application specific integrated circuit (ASIC), or the like. The memory chip may be, for example, a volatile memory chip such as a dynamic random access memory (DRAM) or a static RAM (SRAM), or a non-volatile memory scale chip such as a phase-change RAM (PRAM), a magneto resistive RAM (MRAM), a ferroelectric RAM (FeRAM), or a resistive RAM (RRAM). The memory chip may be a high bandwidth memory (HBM) memory chip in which a plurality of DRAM memory chips is stacked.

The molding part 200 may be formed on the upper face 100a of the substrate 100. The molding part 200 may include a first trench 250 and a second trench 230. The first semiconductor chip 300 may be disposed in the first trench 250, and the second semiconductor chip 400 may be disposed in the second trench 230.

The molding part 200 may be interposed between the first semiconductor chip 300 and the second semiconductor chip 400. The molding part 200 may fill, e.g., completely fill, a space between the first semiconductor chip 300 and the substrate 100, and a space between the second semiconductor chip 400 and the substrate 100. The molding part 200 may fill, e.g., completely fill, the spaces between the second connection terminals 210 adjacent to each other. Thus, the molding part 200 may wrap the first semiconductor chip 300, the second semiconductor chip 400, and the second connection terminal 210.

The molding part 200 may expose the upper face of the first semiconductor chip 300 and the upper face of the second semiconductor chip 400. For example, the upper face of the molding part 200 may be located at the same plane as the upper face of the first semiconductor chip 300 and the upper face of the second semiconductor chip 400.

The molding part 200 may be formed to protect the first semiconductor chip 300 and the second semiconductor chip 400.

The molding part 200 may include, for example, an epoxy molding compound (EMC), or two or more kinds of silicon hybrid materials.

The barrier layer 500 may be disposed on the upper face of the first semiconductor chip 300, the upper face of the second semiconductor chip 400, and the upper face of the molding part 200. The barrier layer 500 may include an opening 510 through which at least a part of the first semiconductor chip 300 is exposed.

A width W2 of the barrier layer 500 may be greater than a width W1 of the second semiconductor chip 400. The barrier layer 500 may cover the entire upper face of the second semiconductor chip 400. The barrier layer 500 may cover at least a part of the upper face of the first semiconductor chip 300.

The second semiconductor chip 400 may have a structure in which a plurality of memory chips is stacked. Each memory chip included in the second semiconductor chip 400 may be thinner than the first semiconductor chip 300.

When a metal material layer is formed on a memory chip included in the second semiconductor chip 400, metal from the metal material layer may diffuse into an element portion of the memory chip, e.g., metal may diffuse into the uppermost memory chip when a metal material layer is formed on the second semiconductor chip 400. The barrier layer 500 disposed on the upper face of the second semiconductor chip 400 may reduce or eliminate the metal diffusion into the memory chip so that the reliability of the second semiconductor chip 400 may be maintained.

The barrier layer 500 may include, for example, a photo imageable dielectric (PID). Thus, the barrier layer 500 may include a photosensitive insulating material. In another implementation, the barrier layer 500 may include epoxy or polyimide.

The heat transfer part 600 may be disposed on the barrier layer 500. The heat transfer part 600 may extend along the upper face of the barrier layer 500.

The heat transfer part 600 may fill the opening 510 of the barrier layer 500. Thus, the heat transfer part 600 may be continuously formed along the upper face of the barrier layer 500 and the upper face of the first semiconductor chip 300.

The heat transfer part 600 may be in direct contact with the first semiconductor chip 300. The heat transfer part 600 may not be in contact with the second semiconductor chip 400, e.g., due to the barrier layer 500 being interposed therebetween.

The first semiconductor chip 300 may be, for example, a logic chip. The first semiconductor chip 300 may generate more heat than the second semiconductor chip 400. As the first semiconductor chip 300 is in direct contact with the heat transfer part 600, the heat generated from the first semiconductor chip 300 may be readily discharged to the outside through the heat transfer part 600. Accordingly, the semiconductor package according to an example embodiment may be improved in reliability and operating performance.

The heat transfer part 600 may include, for example, an adhesive metal layer 610 and a heat transfer material layer 620.

The adhesive metal layer 610 may be continuously formed along the upper face of the barrier layer 500 and the upper face of the first semiconductor chip 300.

The adhesive metal layer 610 may be interposed between the heat transfer material layer 620 and the barrier layer 500. The adhesive metal layer 610 may be interposed between the heat transfer material layer 620 and the first semiconductor chip 300.

The adhesive metal layer 610 enhance adhesion of the heat transfer material layer 620 to the barrier layer 500 and the first semiconductor chip 300. Further, the adhesive metal layer 610 may prevent or reduce the diffusion of metal included in the heat transfer material layer 620 (described in greater detail below) into the first semiconductor chip 300.

The adhesive metal layer 610 may include, for example, at least one of titanium (Ti), titanium-tungsten (Ti—W), chromium (Cr), and aluminum (Al). The adhesive metal layer 610 according to an example embodiment may be titanium (Ti).

The heat transfer material layer 620 may be formed continuously along the adhesive metal layer 610.

A thickness H3 of the heat transfer material layer 620 on the barrier layer 500 may be the same as a thickness H1 of the heat transfer material layer 620 on the first semiconductor chip 300.

The thickness H1 of the heat transfer material layer 620 on the first semiconductor chip 300 and the thickness H3 of the heat transfer material layer 620 on the barrier layer 500 may be greater than a thickness H2 of the barrier layer 500.

Heat generated from the first semiconductor chip 300 and the second semiconductor chip 400 may be discharged to the outside through the heat transfer material layer 620. The heat transfer material layer 620 may be thick. Thus, the heat transfer material layer 620 may effectively discharge heat, which is generated from the first semiconductor chip 300 and the second semiconductor chip 400, to the outside.

According to the present example embodiment, a warpage phenomenon due to a mismatch of thermal expansion coefficients between different kinds of materials may be adjusted using the thickness and rigidity of the heat transfer material layer 620.

The heat transfer material layer 620 may include a material having high heat conductivity. The heat transfer material layer 620 may be, for example, at least one metal material selected from silver (Ag), aluminum (Al), copper (Cu), platinum (Pt), zinc (Zn), nickel (Ni), and iron (Fe), or an alloy of the metal materials. In an example embodiment, the heat transfer material layer 620 may include copper (Cu).

Figure 2:
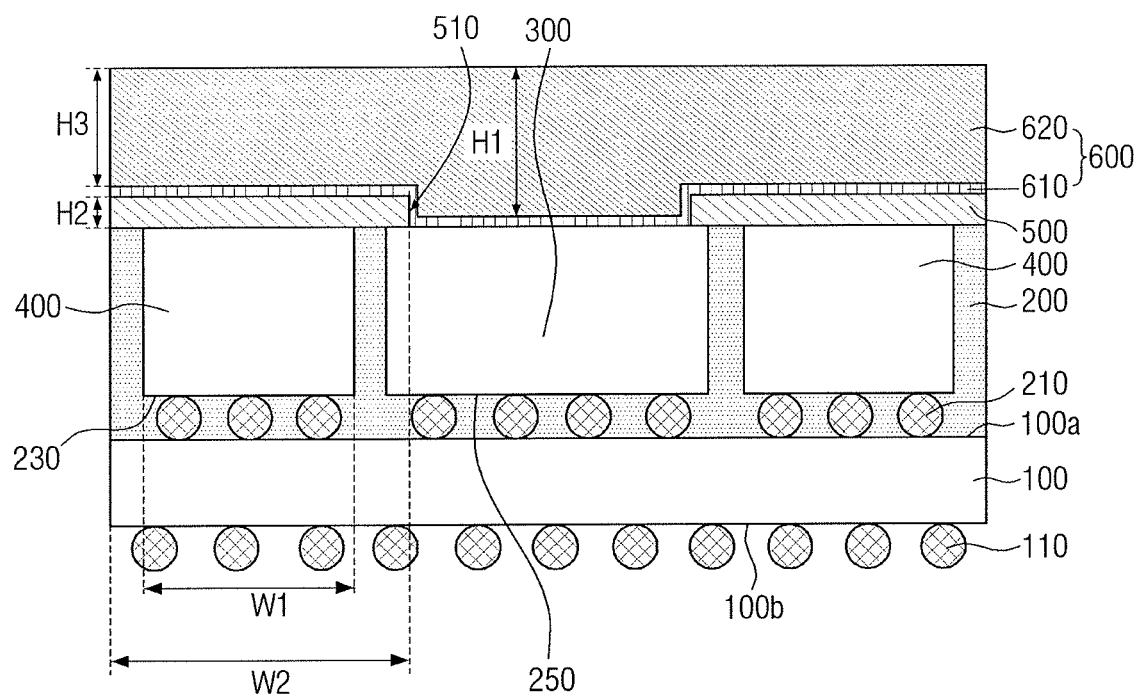
FIG. 2 illustrates a diagram of a semiconductor package according to an example embodiment.

FIG. 2 is a diagram of a semiconductor package according to an example embodiment. For convenience of explanation, the description will focus on differences from the semiconductor package according to an example embodiment described above.

Referring to FIG. 2, the semiconductor package according to the present example embodiment may include the substrate 100, the first connection terminal 110, the molding part 200, the second connection terminal 210, the first semiconductor chip 300, the second semiconductor chip 400, the barrier layer 500, and the heat transfer part 600.

According to the present example embodiment, the thickness H1 of the heat transfer material layer 620 on the first semiconductor chip 300 may be greater than the thickness H3 of the heat transfer material layer 620 on the barrier layer 500.

The thickness H1 of the heat transfer material layer 620 on the first semiconductor chip 300 may be substantially the same as the sum of the thickness H2 of the barrier layer 500 and the thicknesses H3 of the heat transfer material layer 620 on the barrier layer 500.

Thus, a step may not be formed on the upper face of the heat transfer material layer 620.

Figure 3:
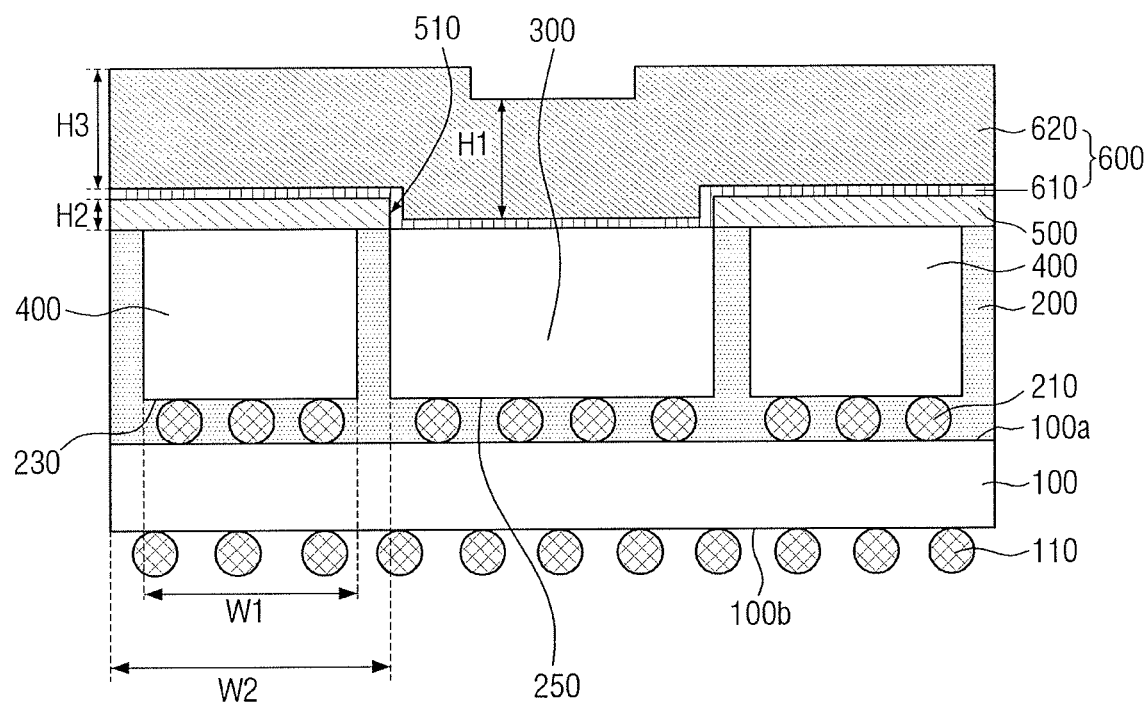
FIG. 3 illustrates a diagram of a semiconductor package according to an example embodiment.

FIG. 3 is a diagram of a semiconductor package according to an example embodiment. For convenience of explanation, the description will focus on differences from the semiconductor package according to an example embodiment described above.

Referring to FIG. 3, the semiconductor package according to the present example embodiment may include the substrate 100, the first connection terminal 110, the molding part 200, the second connection terminal 210, the first semiconductor chip 300, the second semiconductor chip 400, the barrier layer 500, and the heat transfer part 600.

The barrier layer 500 may be disposed on the second semiconductor chip 400. The barrier layer 500 may include the opening 510 that exposes the entire upper face of the first semiconductor chip 300.

The barrier layer 500 may cover the entire upper face of the second semiconductor chip 400. The barrier layer 500 may not cover the entire upper face of the first semiconductor chip 300. For example, the barrier layer 500 may not extend over the first semiconductor chip 300. In another implementation, the barrier layer 500 may be formed up to a certain point between the upper face of the first semiconductor chip 300 and the upper face of the second semiconductor chip 400.

Figure 4:
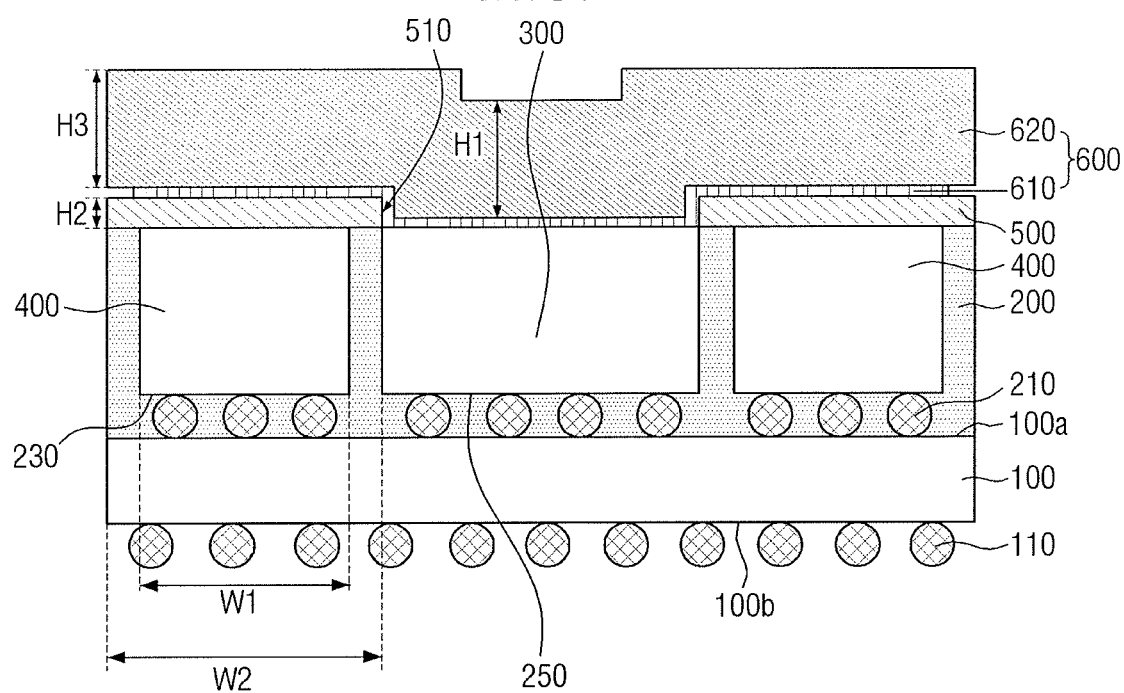
FIG. 4 illustrates a diagram of a semiconductor package according to an example embodiment.

FIG. 4 is a diagram of a semiconductor package according to an example embodiment. For convenience of explanation, the description will focus on differences from the semiconductor package according to an example embodiment described above.

Referring to FIG. 4, the semiconductor package according to the present example embodiment may include the substrate 100, the first connection terminal 110, the molding part 200, the second connection terminal 210, the first semiconductor chip 300, the second semiconductor chip 400, the barrier layer 500, and the heat transfer part 600.

The adhesive metal layer 610 may be continuously formed along the upper face of the barrier layer 500 and the upper face of the first semiconductor chip 300. An undercut may be formed at an end portion of the adhesive metal layer 610. For example, lateral edges of the adhesive metal layer 610 may be inset towards the center of the semiconductor package. The undercut of the adhesive metal layer 610 may be formed, for example, in a process of removing the adhesive metal layer 610 from the molding part 200.

The thickness H1 of the heat transfer material layer 620 on the first semiconductor chip 300 may be greater than the thickness H3 of the heat transfer material layer 620 on the barrier layer 500.

The upper face of the heat transfer material layer 620 on the barrier layer 500 may be disposed on the same plane as the upper face of the heat transfer material layer 620 on the first semiconductor chip 300.

A step may not be formed on the upper face of the heat transfer material layer 620.

Figure 5:
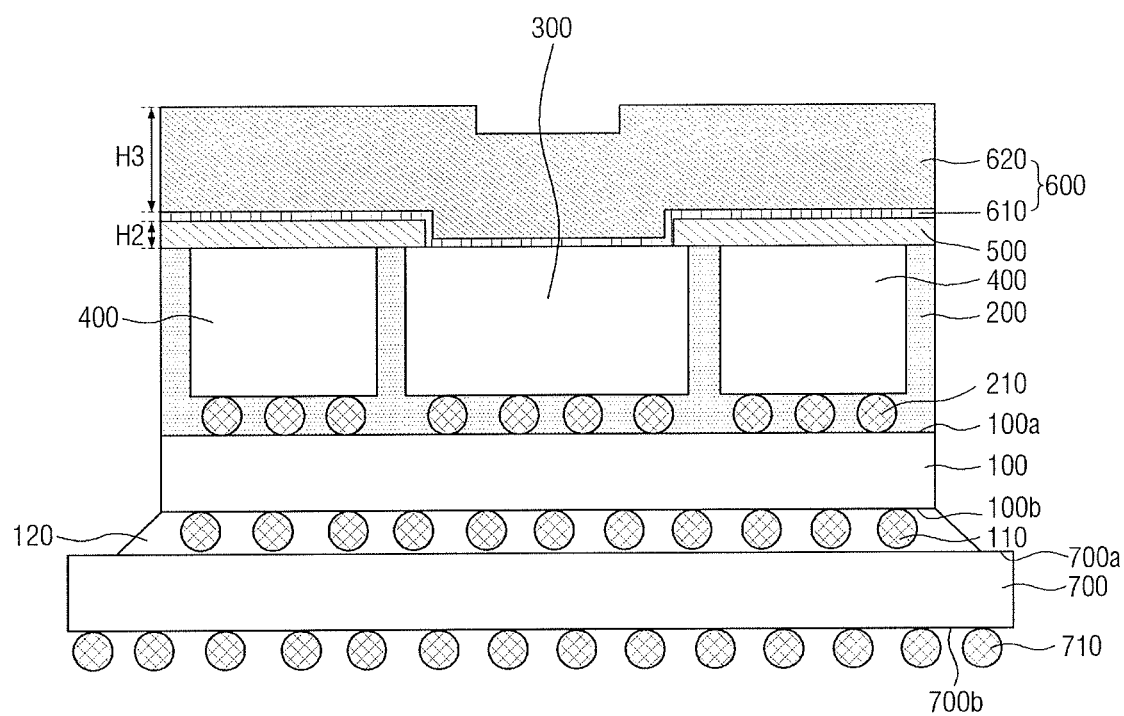
FIG. 5 illustrates a diagram of a semiconductor package according to an example embodiment.

FIG. 5 is a diagram of a semiconductor package according to an example embodiment. For convenience of explanation, the description will focus on differences from the semiconductor package according to an example embodiment described above.

Referring to FIG. 5, the semiconductor package according to the present example embodiment may include a package substrate 700.

The package substrate 700 may be a printed circuit board (PCB), a ceramic substrate, or the like. The package substrate 700 may include a plurality of insulating films and internal wiring layers.

The package substrate 700 may include an upper face 700a and a lower face 700b facing each other.

A semiconductor package according to another example embodiment may be disposed on the upper face 700a of the package substrate 700.

The third connection terminal 710 may be disposed on the lower face 700b of the package substrate 700. The third connection terminal 710 may be, for example, a conductive ball or a solder ball.

The semiconductor package may be electrically connected to an external device through the third connection terminal 710. The number of the third connection terminals 710 shown in the drawing is for convenience of explanation, and may be varied.

The package substrate 700 and the substrate 100 may be electrically connected to each other through the first connection terminal 110. An underfill material 120 may fill a space between the first connection terminals 110 adjacent to each other. The underfill material 120 may protect the first connection terminals 110.

The underfill material 120 may include, for example, an epoxy-based resin, benzocyclobutene, or polyimide. In an example embodiment, the underfill material 120 may further include a silica filler. In an example embodiment, the underfill material 120 may include an adhesive and a flux. The flux may include an oxide film remover. In an example embodiment, the underfill material 120 may include silica filler or flux. In an example embodiment, the underfill material 120 may include a non-conductive paste.

Figure 6:
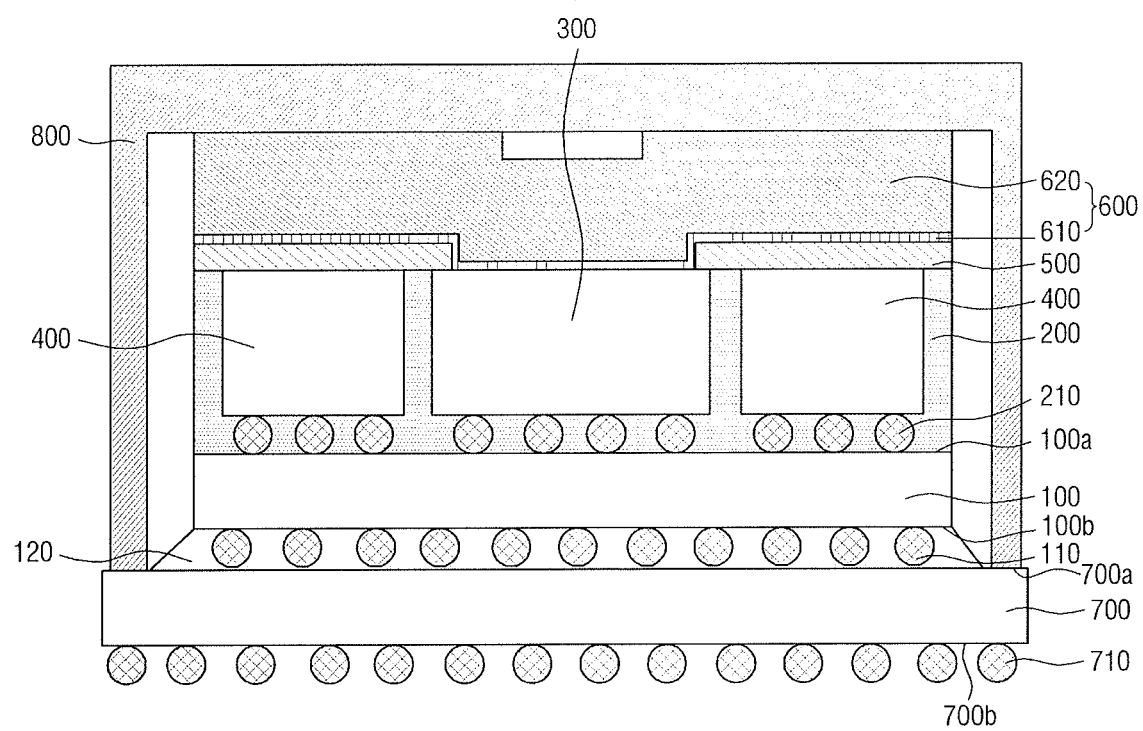
FIG. 6 illustrates a diagram of a semiconductor package according to an example embodiment.

FIG. 6 is a diagram of a semiconductor package according to an example embodiment. For convenience of explanation, the description will focus on differences from the semiconductor package according to an example embodiment described above.

Referring to FIG. 6, the semiconductor package according to the present example embodiment may include a heat slug 800.

The heat slug 800 may extend from one side of the package substrate 700 to the other side. The heat slug 800 may extend along the upper face of the heat transfer part 600.

The heat slug 800 may be in contact with the heat transfer part 600. For example, the heat slug 800 may be in contact with the heat transfer material layer 620.

Heat generated in the semiconductor package may be transferred to the heat transfer part 600. The heat transferred to the heat transfer part 600 may easily escape to the outside through the heat slug 800.

The semiconductor package according to the present example embodiment includes the heat transfer material layer 620 and the heat slug 800. Thus, the thermal characteristics of the semiconductor package may be enhanced.

The heat slug 800 may include a metal and may have a higher thermal conductivity than air. For example, the heat slug 800 may include copper (Cu), iron (Fe), nickel (Ni), cobalt (Co), tungsten (W), chromium (Cr), silver (Ag), gold (Au), platinum (Pt), tin (Sn), aluminum (Al), magnesium (Mg), silicon (Si), zinc (Zn), or combinations thereof.

Figure 7:
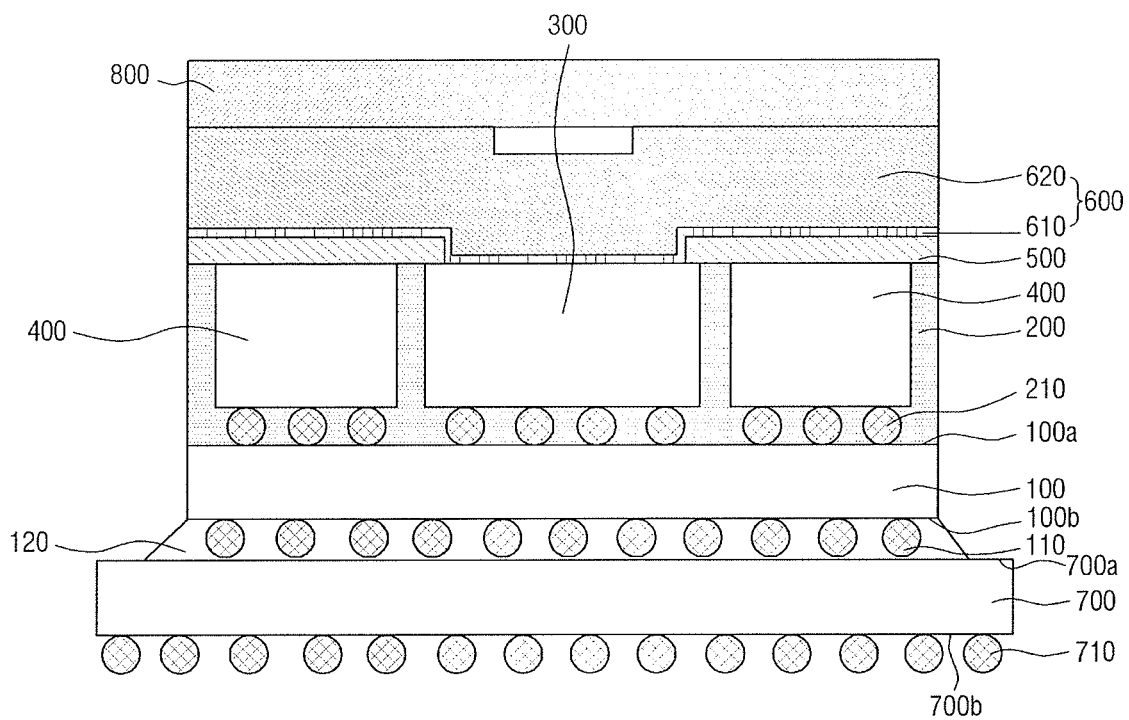
FIG. 7 illustrates a diagram of a semiconductor package according to an example embodiment.

FIG. 7 is a diagram of a semiconductor package according to an example embodiment. For convenience of explanation, the description will focus on differences from the semiconductor package according to an example embodiment described above.

In the present example embodiment, the heat slug 800 may be disposed on the heat transfer part 600, e.g., only on an upper surface thereof. The heat slug 800 may be in contact with the heat transfer part 600. For example, the heat slug 800 may be in contact with the heat transfer material layer 620.

Heat generated in the semiconductor package may be transferred to the heat transfer part 600. Heat transferred to the heat transfer part 600 may easily escape to the outside through the heat slug 800.

A method of fabricating a semiconductor package according to an example embodiment will now be described with reference to FIGS. 8 to 16.

FIGS. 8 to 16 illustrate stages in a method of fabricating a semiconductor package according to an example embodiment.

Figure 8:
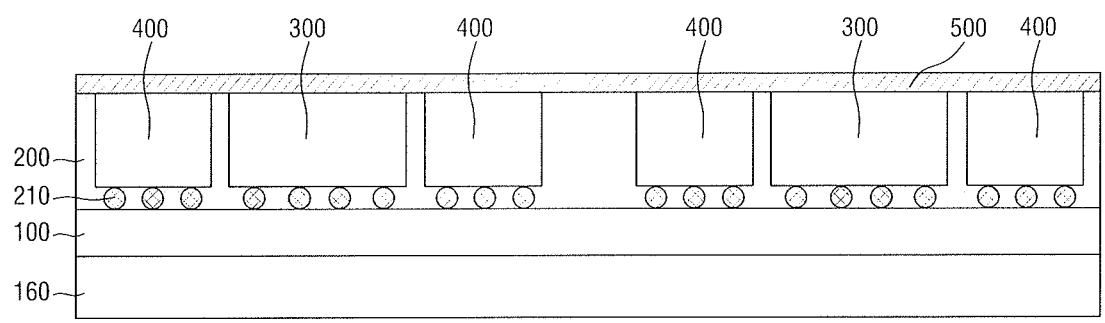
FIG. 8 illustrates a stage in a method of fabricating a semiconductor package according to an example embodiment.

Referring to FIG. 8, the substrate 100 may include the first semiconductor chip 300, the second semiconductor chip 400, and the molding part 200. The substrate 100 may be attached to a carrier 160.

The first trench 250 and the second trench 230 may be formed in the molding part 200.

The first semiconductor chip 300 may be mounted in the first trench 230. The second semiconductor chip 400 may be mounted in the second trench 250.

The upper face of the molding part 200 may have the same plane as the upper face of the first semiconductor chip 300 and the upper face of the second semiconductor chip 400.

The substrate 100 may be attached to the top of the carrier 160. The substrate 100 attached to the carrier 160 may be easily handled. Further, since the substrate 100 is attached to the carrier 160, damage and warpage of the substrate 100 may be reduced or prevented.

The carrier 160 may include, for example, silicon, metal, glass, plastic, ceramic, or the like.

Subsequently, the barrier layer 500 may be formed on the upper face of the first semiconductor chip 300, the upper face of the second semiconductor chip 400, and the upper face of the molding part 200.

The barrier layer 500 may be formed by a deposition or coating process. The barrier layer 500 may include a photosensitive polymer having positive photosensitivity. Alternatively, the barrier layer 500 may include a photosensitive polymer having negative photosensitivity.

Figure 9:
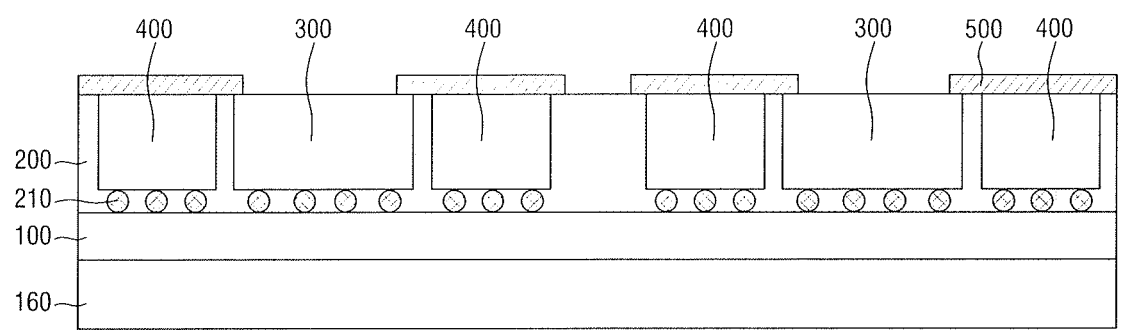
FIG. 9 illustrates a stage in a method of fabricating a semiconductor package according to an example embodiment.

Referring to FIG. 9, a part of the barrier layer 500 may be removed. For example, the barrier layer 500 may be removed to expose at least a part of the first semiconductor chip 300.

When the barrier layer 500 includes a photosensitive polymer having negative photosensitivity, the light-shielded portion of the barrier layer 500 may be removed by a developer. The exposed portion of the barrier layer 500 may remain even after development. Therefore, the barrier layer 500 on the first semiconductor chip 300 may be shielded from light.

When the barrier layer 500 includes a photosensitive polymer having positive photosensitivity, the exposed portion of the barrier layer 500 may be removed by a developer. The light-shielded portion of the barrier layer 500 may remain even after development. Therefore, the barrier layer 500 on the first semiconductor chip 300 may be exposed.

Figure 10:
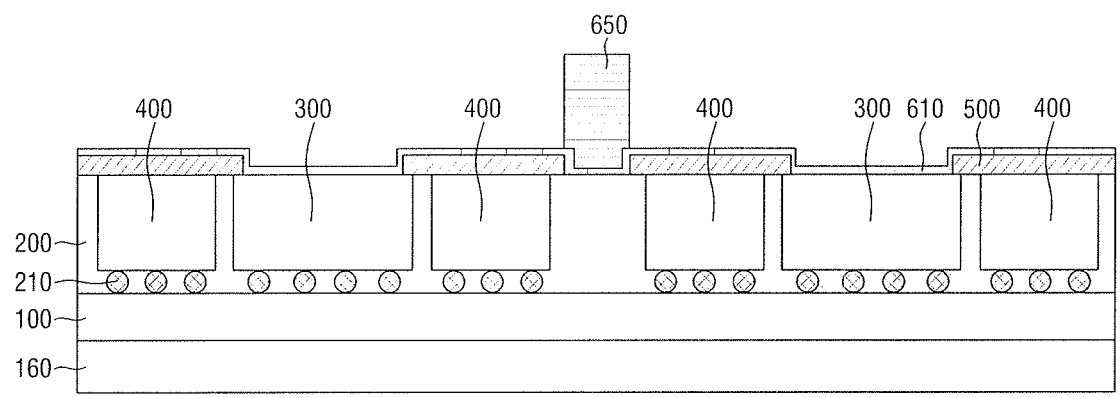
FIG. 10 illustrates a stage in a method of fabricating a semiconductor package according to an example embodiment.

Referring to FIG. 10, the adhesive metal layer 610 may be formed on the barrier layer 500 and the exposed first semiconductor chip 300.

The adhesive metal layer 610 may cover the upper face and the side face of the barrier layer 500. The adhesive metal layer 610 may cover the upper face of the exposed first semiconductor chip 300.

The adhesive metal layer 610 may include titanium (Ti), for example.

The adhesive metal layer 610 may be formed using, for example, methods such as a physical vapor deposition (PVD) method, a sputtering method, and a chemical vapor deposition (CVD) method.

Net, a mask pattern 650 may be formed on the adhesive metal layer 610.

The mask pattern 650 may be formed on the upper face of the adhesive metal layer 610 between the semiconductor packages adjacent to each other.

The mask pattern 650 may be formed through a photoresist application and a patterning process.

Figure 11:
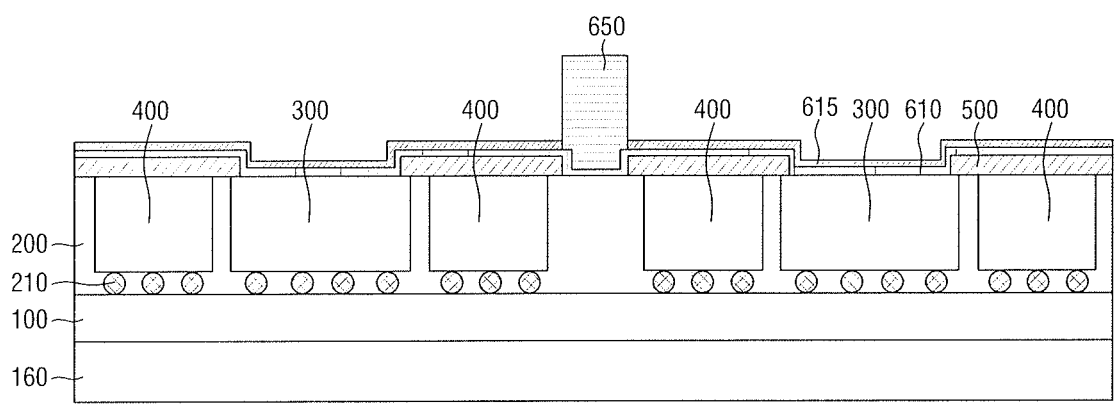
FIG. 11 illustrates a stage in a method of fabricating a semiconductor package according to an example embodiment.

Referring to FIG. 11, a seed layer 615 may be formed on the adhesive metal layer 610. The seed layer 615 on the upper face of the adhesive metal layer 610 may be used as a seed layer of the heat transfer material layer 620.

The seed layer 615 may be formed on the upper face of the adhesive metal layer 610 exposed by the mask pattern 650.

The seed layer 615 may include copper (Cu), for example.

The seed layer 615 may be formed using, for example, methods such as a physical vapor deposition (PVD) method, a sputtering method, and a chemical vapor deposition (CVD) method.

Figure 12:
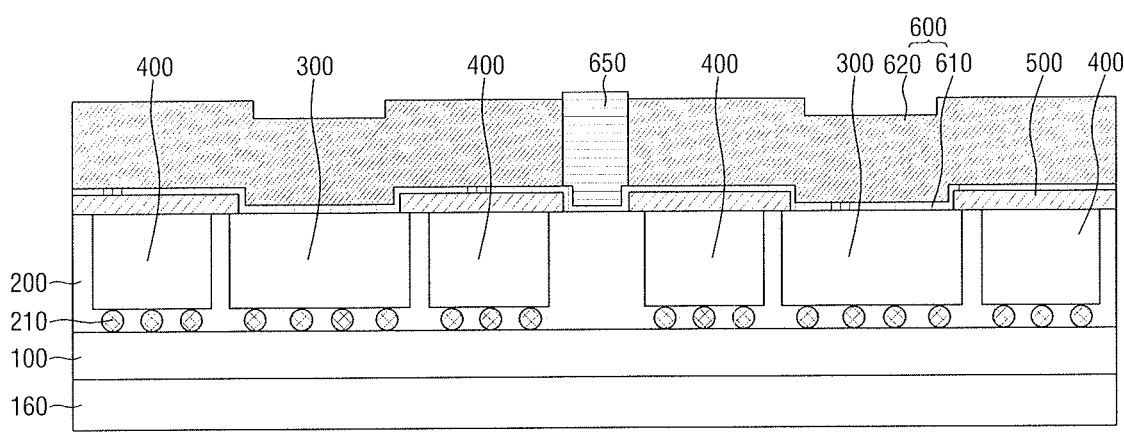
FIG. 12 illustrates a stage in a method of fabricating a semiconductor package according to an example embodiment.

Referring to FIG. 12, the heat transfer material layer 620 may be formed. The heat transfer material layer 620 may be grown by, for example, an electroplating method on the seed layer 615.

The heat transfer material layer 620 may be formed on the seed layer 615 exposed by the mask pattern 650. The uppermost face of the heat transfer material layer 620 may be lower than the uppermost face of the mask pattern 650.

The thickness of the heat transfer material layer 620 may be greater than the thickness of the barrier layer 500. The thickness of the heat transfer material layer 620 may be adjusted depending on the process conditions.

Figure 13:
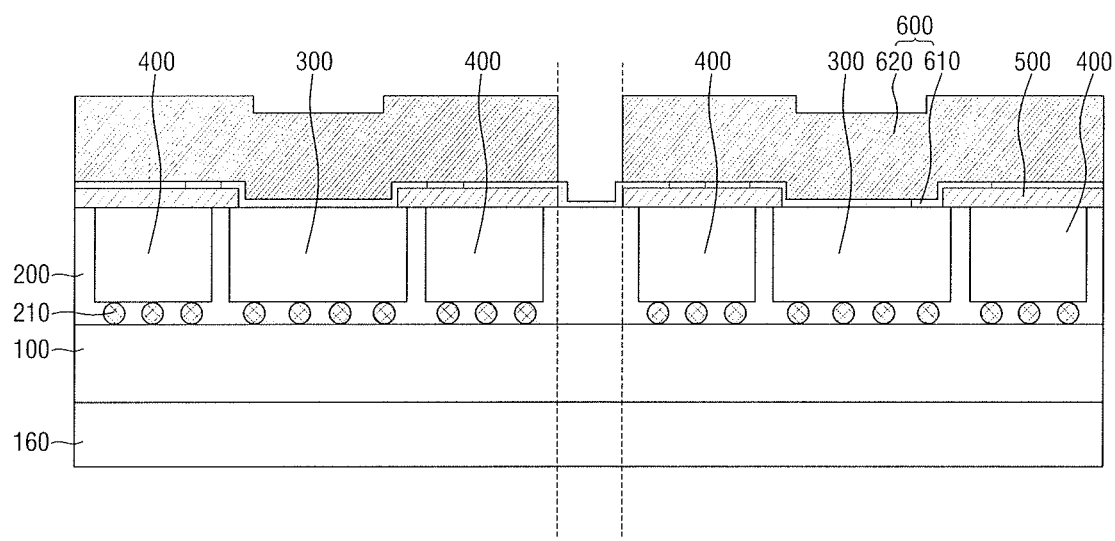
FIG. 13 illustrates a stage in a method of fabricating a semiconductor package according to an example embodiment.

Referring to FIG. 13, after the heat transfer material layer 620 is formed, the mask pattern 650 may be removed. A part of the adhesive metal layer 610 may be exposed by the removal of the mask pattern 650. The exposed adhesive metal layer 610 may be at a location to be diced in a subsequent process.

Figure 14:
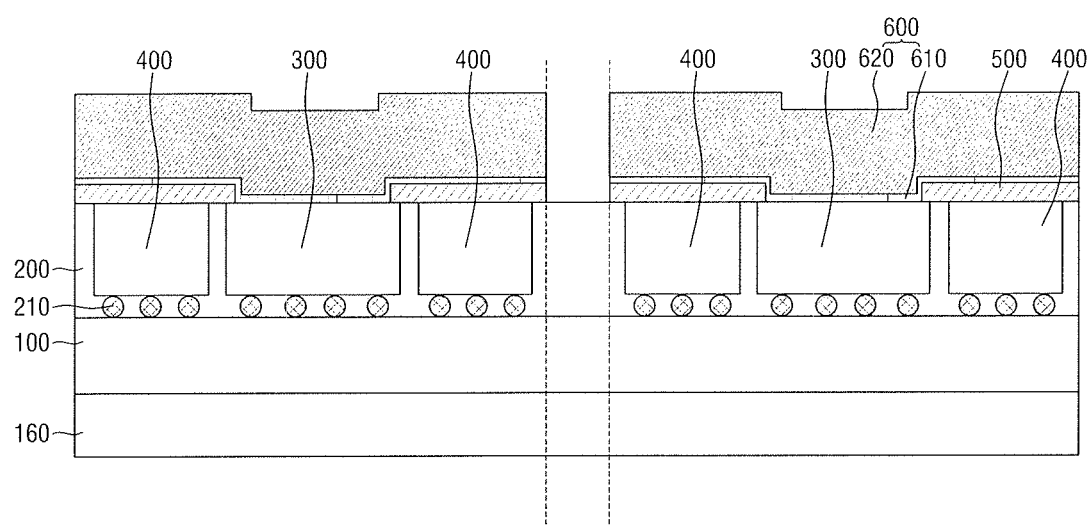
FIG. 14 illustrates a stage in a method of fabricating a semiconductor package according to an example embodiment.

Referring to FIG. 14, the exposed adhesive metal layer 610 may be removed. The adhesive metal layer 610 may be removed for the convenience of the dicing process.

The adhesive metal layer 610 may be removed from the substrate 100 using, for example, an etching process. The adhesive metal layer 610 may be removed using, for example, a wet etching process. A wet etching process solution may selectively etch only the adhesive metal layer 610. The wet etching process solution may not damage the heat transfer material layer 620 or the barrier layer 500.

In an implementation, in the wet etching process, the wet etching process solution may permeate into the end of the adhesive metal layer 610. For example, as shown in FIG. 4, an undercut may occur at the end of the adhesive metal layer 610.

Figure 15:
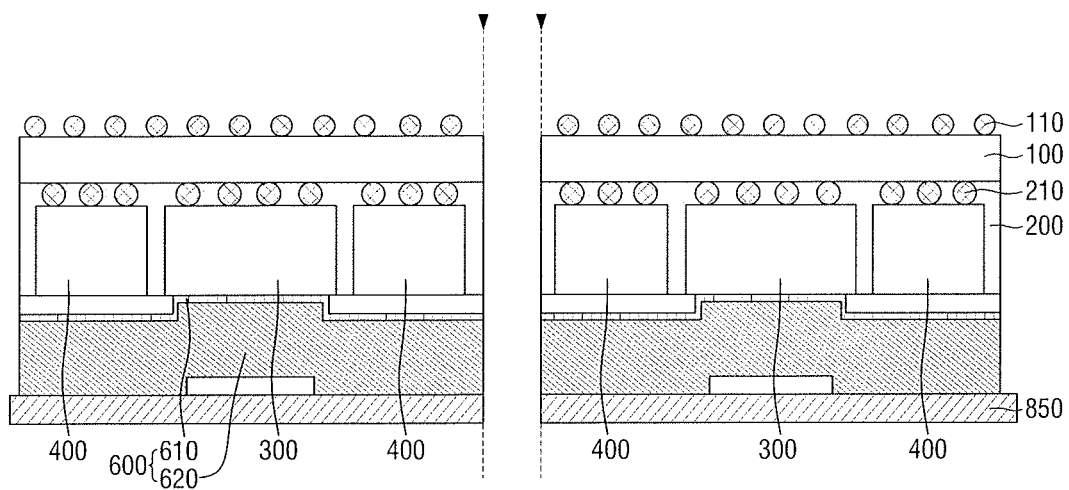
FIG. 15 illustrates a stage in a method of fabricating a semiconductor package according to an example embodiment.

Referring to FIG. 15, a tape 850 may be attached on the heat transfer material layer 620. Subsequently, the top and bottom of the semiconductor package may be inverted.

After temporarily fixing the semiconductor package with the tape 850, the carrier 160 may be removed from the substrate 100. Subsequently, a plurality of semiconductor packages may be diced for each semiconductor package through a dicing process. In the dicing process, a cutting wheel or a laser may be used.

The first connection terminal 110 may be attached to the lower face of the substrate 100 to which no semiconductor package is attached.

Figure 16:
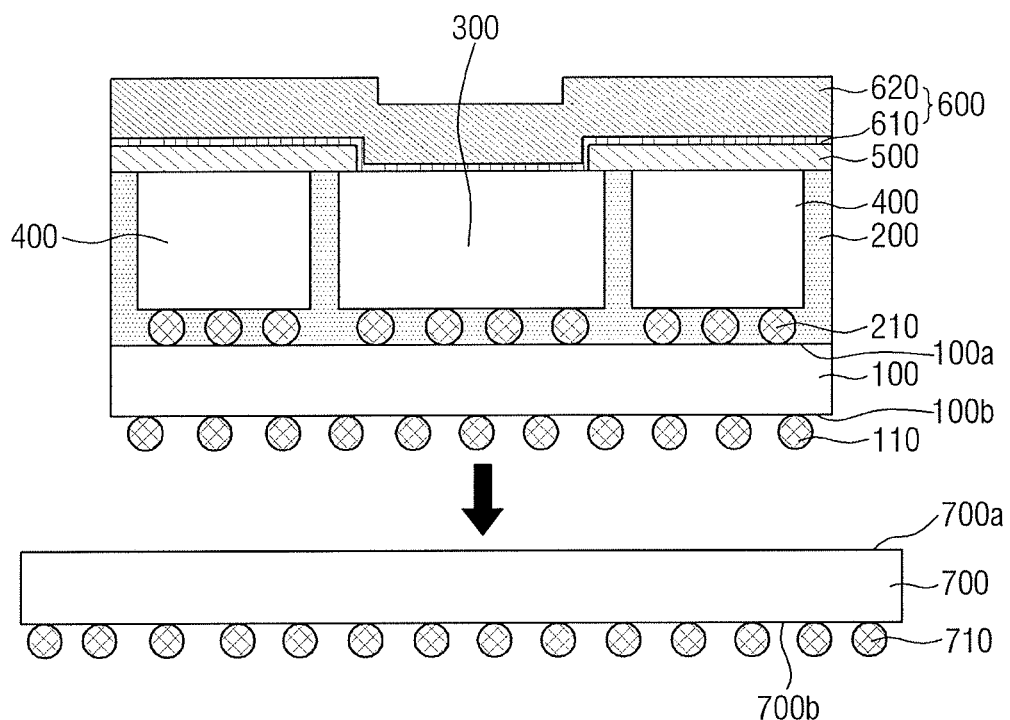
FIG. 16 illustrates a stage in a method of fabricating a semiconductor package according to an example embodiment.

Referring to FIG. 16, the tape 850 on the heat transfer material layer 620 may be removed.

The semiconductor package, from which the tape 850 is removed, may be disposed on the upper face 700a of the package substrate 700.

The package substrate 700 may be a printed circuit board (PCB). The package substrate 700 may be electrically connected to the substrate 100 through the first connection terminal 110. The package substrate 700 may be connected to an external device through the third connection terminal 710.

Subsequently, referring again to FIG. 6, the heat slug 800 may be further formed on the package substrate 700. For example, referring again to FIG. 7, the heat slug 800 may be further formed on the heat transfer material layer 620.

By way of summation and review, effectively dissipating heat generated from a semiconductor chip is desired.

As described above, embodiments may provide a semiconductor package that effectively controls heat generated from a semiconductor chip. Embodiments may also provide a semiconductor package with improved product reliability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
    a first semiconductor chip and a second semiconductor chip on a substrate, the first and second semiconductor chips being equal in thickness such that uppermost faces of the first and second semiconductor chips are located at a same height from the substrate;
    a barrier layer having an opening that exposes a first portion of the uppermost face of the first semiconductor chip, the barrier layer being in contact with a second portion of the uppermost face of the first semiconductor chip not exposed by the opening and an entirety of the uppermost face of the second semiconductor chip; and
    a heat transfer part on the barrier layer, the heat transfer part extending along an upper face of the barrier layer and filling the opening.

2. The semiconductor package as claimed in claim 1, wherein a thickness of the heat transfer part is greater than a thickness of the barrier layer.

3. The semiconductor package as claimed in claim 1, wherein the heat transfer part on the first semiconductor chip has substantially the same thickness as the heat transfer part on the barrier layer.

4. The semiconductor package as claimed in claim 1, wherein the heat transfer part on the first semiconductor chip is thicker than the heat transfer part on the barrier layer.

5. The semiconductor package as claimed in claim 1, wherein the barrier layer includes a photosensitive polymer.

6. The semiconductor package as claimed in claim 1, wherein:
    the heat transfer part includes an adhesive metal layer and a heat transfer material layer on an upper face of the adhesive metal layer, and
    an undercut region is formed at an end of the adhesive metal layer.

7. The semiconductor package as claimed in claim 1, wherein:

the heat transfer part includes an adhesive metal layer and a heat transfer material layer on an upper face of the adhesive metal layer, and a portion of the heat transfer part is in contact with the first portion of the uppermost face of the first semiconductor chip.

8. The semiconductor package as claimed in claim 1, wherein the first semiconductor chip is a logic chip, the second semiconductor chip is a memory chip, and the first semiconductor chip and the second semiconductor chip are electrically connected to each other through the substrate.

9. The semiconductor package as claimed in claim 1, further comprising a heat slug on the heat transfer part.

10. A semiconductor package, comprising:
a first semiconductor chip on a substrate, the first semiconductor chip having an uppermost face located at a first height from the substrate;
a second semiconductor chip on the substrate, the second semiconductor chip having an uppermost face located at the first height from the substrate such that the uppermost faces of the first and second semiconductor chips are located at a same level;
a heat transfer part on the first semiconductor chip and the second semiconductor chip, the heat transfer part being in contact with the uppermost face of the first semiconductor chip, and not contacting the second semiconductor chip; and
a heat slug in contact with at least a portion of the heat transfer part.

11. The semiconductor package as claimed in claim 10, wherein a thickness of the heat transfer part on the first semiconductor chip is substantially the same as a thickness of the heat transfer part on the second semiconductor chip.

12. The semiconductor package as claimed in claim 11, wherein the heat slug is in contact with the heat transfer part on the first semiconductor chip and not in contact with the heat transfer part on at least a portion of the second semiconductor chip.

13. The semiconductor package as claimed in claim 10, wherein the heat transfer part on the first semiconductor chip is thicker than the heat transfer part on the second semiconductor chip.

14. The semiconductor package as claimed in claim 10, further comprising a barrier layer between the second semiconductor chip and the heat transfer part.

15. The semiconductor package as claimed in claim 14, wherein the heat transfer part is thicker than the barrier layer.

16. The semiconductor package as claimed in claim 10, wherein an undercut region is formed at an end of the heat transfer part.

17. The semiconductor package as claimed in claim 10, wherein the heat slug extends from one side of the substrate to the other side of the substrate.

18. A semiconductor package, comprising:
a substrate;
a first semiconductor chip on the substrate;
a second semiconductor chip on the substrate, an uppermost face of the second semiconductor chip being located at a same height as an uppermost face of the first semiconductor chip;
a molding part on the substrate, wrapping the first semiconductor chip and the second semiconductor chip, and exposing the uppermost face of the first semiconductor chip and the uppermost face of the second semiconductor chip, an uppermost face of the molding part being located at the same height as the uppermost face of the first semiconductor chip;
a barrier layer including an opening through which a first portion of the uppermost face of the first semiconductor chip is exposed, the barrier layer covering the second semiconductor chip and a second portion of the uppermost face of the first semiconductor chip not exposed by the opening; and
a heat transfer part on the barrier layer and in direct contact with the first portion of the uppermost face of the first semiconductor chip exposed by the opening.

19. The semiconductor package as claimed in claim 18, further comprising a heat slug on the heat transfer part.

20. The semiconductor package as claimed in claim 18, wherein:
the second semiconductor chip has a structure in which a plurality of memory chips is stacked, and
each memory chip is thinner than the first semiconductor chip.

* * * * *